United States Patent [19]

Schaefer

[11] Patent Number: 5,600,605
[45] Date of Patent: Feb. 4, 1997

[54] AUTO-ACTIVATE ON SYNCHRONOUS DYNAMIC RANDOM ACCESS MEMORY

[75] Inventor: Scott Schaefer, Boise, Id.

[73] Assignee: Micron Technology, Inc., Boise, Id.

[21] Appl. No.: 481,920

[22] Filed: Jun. 7, 1995

[51] Int. Cl.$^6$ .................................................. G11C 7/00
[52] U.S. Cl. ..................... 365/233; 365/230.03
[58] Field of Search .................. 365/233, 203, 365/222, 230.03

[56] References Cited

U.S. PATENT DOCUMENTS

| | | | |
|---|---|---|---|
| 5,208,779 | 5/1993 | Walther et al. | 365/222 |
| 5,229,969 | 7/1993 | Lee et al. | 365/222 |
| 5,229,970 | 7/1993 | Lee et al. | 365/222 |
| 5,257,233 | 10/1993 | Schaefer | 365/227 |
| 5,335,201 | 8/1994 | Walther et al. | 365/222 |
| 5,444,667 | 8/1995 | Obara | 365/233 |
| 5,463,581 | 10/1995 | Koshikawa | 365/189.01 |
| 5,471,430 | 11/1995 | Sawada | 365/222 |

FOREIGN PATENT DOCUMENTS 0561306  9/1993  European Pat. Off. .

OTHER PUBLICATIONS

Yasuhiro Takai, et al., "250 Mbyte/s Synchronous DRAM Using a 3-Stage pipelined Architecture", *IEEE Journal of Solid–State Circuits*, No. 4, pp. 426–430, (Apr. 1994).

Kazuyuki Nakamura, et al., "A 220–MHz Pipelined 16–Mb BiCMOS SRAM with PLL Proportional Self–Timing Generator", *IEEE Journal of Solid–State Circuits*, No. 11, pp. 1317–1321, (Nov. 1994).

*Primary Examiner*—Viet Q. Nguyen
*Assistant Examiner*—Son Mai
*Attorney, Agent, or Firm*—Schwegman, Lundberg, Woessner & Kluth, P.A.

[57] ABSTRACT

A synchronous dynamic random access memory (SDRAM) includes a memory array and is responsive to command signals and address bits. A command decoder/controller responds to selected command signals to initiate, at different times, a precharge command, an active command, and a transfer command. The command decoder/controller initiates the active command during the precharge command. Indicating circuitry responds to the precharge command to provide a precharge complete signal indicating the completion of a precharge command operation. A row address latch responds to the active command to receive and hold a value representing a row address of the memory array as indicated by the address bits provided at the time the active command is initiated, and responds to the precharge complete signal to release the row address.

24 Claims, 4 Drawing Sheets

AUTO-ACTIVATE ON SYNCHRONOUS DYNAMIC RANDOM ACCESS MEMORY

THE FIELD OF THE INVENTION

The present invention relates semiconductor memory integrated circuits and, more particularly to synchronous dynamic random access memories.

BACKGROUND OF THE INVENTION

A synchronous dynamic random access memory (SDRAM) is designed to operate in a synchronous memory system. Thus, all input and output signals, with the exception of a clock enable signal during power down and self refresh modes, are synchronized to an active edge of a system clock.

SDRAMs offer substantial advances in dynamic memory operating performance. For example, some SDRAMs are capable of synchronously providing burst data in a burst mode at a high-speed data rate by automatically generating a column address to address a memory array of storage cells organized in rows and columns for storing data within the SDRAM. In addition, if the SDRAM includes two banks of memory arrays, the SDRAM preferably permits interleaving between the two banks to hide precharging time.

In an asynchronous DRAM, once row and column addresses are issued to the DRAM and a row address strobe signal and column address strobe signal are deactivated, the DRAM's memory is precharged and available for another access. Another row cannot be accessed in the DRAM array, however, until the previous row access is completed.

By contrast, a SDRAM requires separate commands for accessing and precharging a row of storage cells in the SDRAM memory array. Once row and column addresses are provided to a SDRAM in a SDRAM having multiple bank memory array's, a bank memory array which is accessed remains active. An internally generated row address strobe remains active and the selected row is open until a PRECHARGE command deactivates and precharges the selected row of the memory array.

In a SDRAM, a transfer operation involves performing a PRECHARGE command operation to deactivate and precharge a previously accessed bank memory army, performing an ACTIVE command operation to register the row address and activate the bank memory array to be accessed in the transfer operation, and performing the transfer READ or WRITE command to register the column address and initiate a burst cycle. At many frequencies, the time to perform the PRECHARGE command operation, and the ACTIVE command operation results in wasted time which adds up to an extra clock cycle resulting in a wait cycle. Thus, there is a need to eliminate possible wasted clock cycles between random READS and writes in a SDRAM.

SUMMARY OF THE INVENTION

The present invention provides a memory device having a memory array of storage cells organized in rows and column for storing data and responsive to command signals. The memory device operates in synchronization with active edges of a system clock, and includes a command decoder/controller responsive to selected command signals to initiate, at a first active edge of the system clock, a first command controlling a first operation on the memory array. The command decoder/controller further initiates, at a second active edge of the system clock, a second command controlling a second operation on the memory array. The second active edge of the system clock occurs during the fast operation. Indicating circuitry responds to the first command to provide a fast command complete signal indicating the completion of the first operation. Second circuitry responds to the second command to perform a fast portion of the second operation, and responds to the fast command complete signal to perform a second portion of the second operation.

In one preferred embodiment of the present invention, the second command is an active command. In this embodiment, the fast portion of the second operation includes receiving and holding a value representing a row address of the memory array. The second portion of the second operation includes releasing the row address and activating a row of storage cells in the memory array.

In one preferred embodiment of the present invention, the first command is a precharge command wherein the first operation includes precharging and deactivating the memory array. Optionally, the first command is a transfer command wherein the first operation includes a first transfer operation portion for transferring data to or from a storage cell in the memory array and a second auto-precharge operation portion wherein the command decoder/controller automatically initiates the auto-precharge operation portion after the transfer operation portion. The transfer command can be a read command or a write command.

In one preferred embodiment of the memory device, the indicating circuitry includes a timeout circuit. In another preferred embodiment of the memory device, the indicating circuitry includes a monitoring circuit.

In one preferred embodiment of the present invention, the memory device is a synchronous dynamic random access memory (SDRAM). The SDRAM preferably includes a second memory array so that the SDRAM is structured to include two bank memory arrays. In this preferred form of the present invention, the SDRAM is further responsive to a bank select bit for selecting the bank memory array for a transfer operation.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
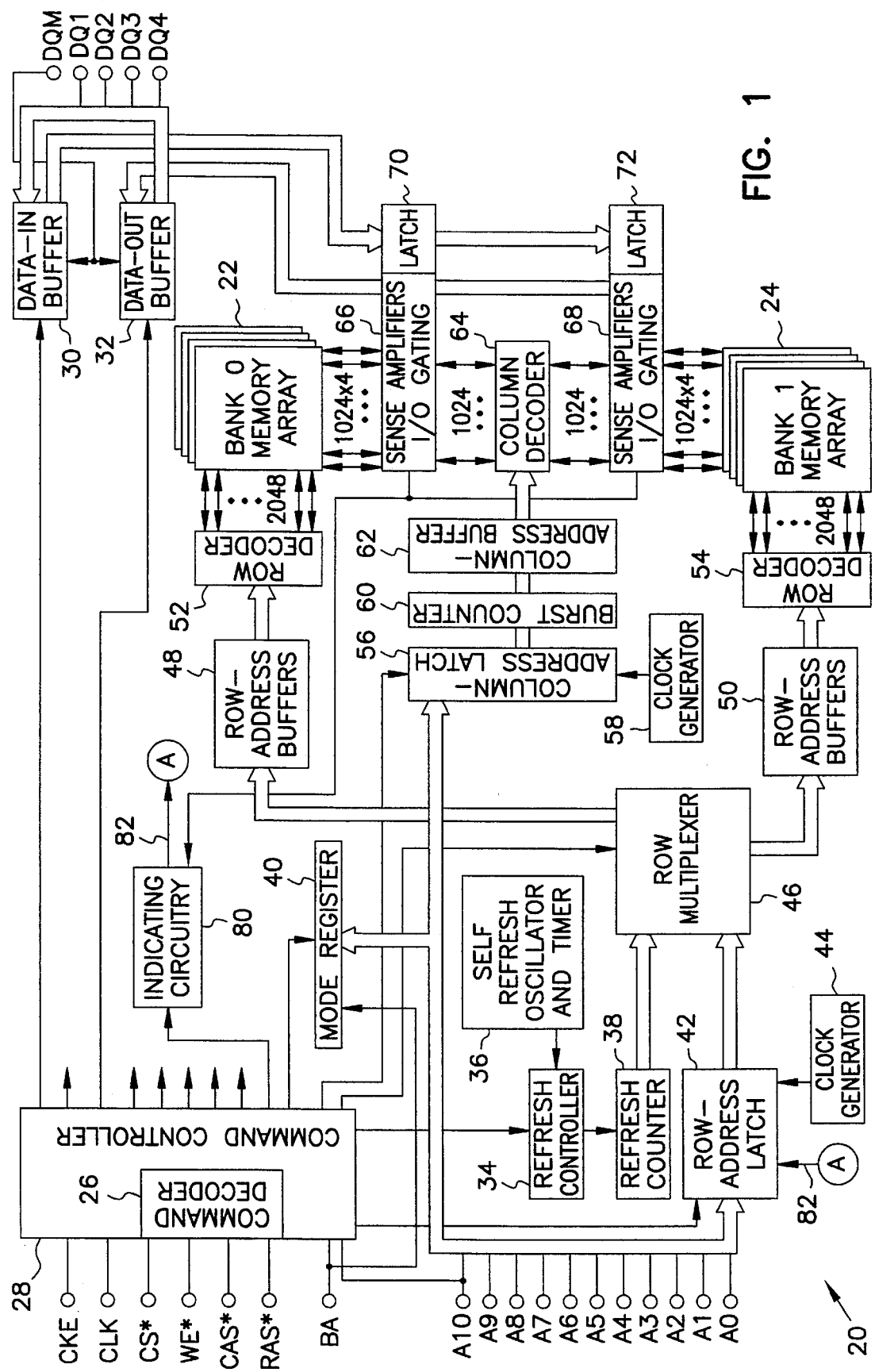
FIG. 1 is a block diagram of a SDRAM according to the present invention.

A synchronous dynamic random access memory (SDRAM) according to the present invention is illustrated generally at 20 in FIG. 1 in block diagram form. Much of the circuitry of SDRAM 20 is similar to circuitry in known SDRAMs, such as the Micron Technology, Inc. MT48LC4M4R1 S 4 MEG X 4 SDRAM, which is described in detail in the corresponding Micron Technology, Inc. Functional Specification, which is incorporated herein by reference. SDRAM 20 includes a bank 0 memory array 22 and of bank 1 memory array 24 which both comprise storage cells organized in rows and columns for storing data. In one embodiment of SDRAM 20, each bank memory array comprises four separate arrays of 2048 rows ×1024 columns.

As is illustrated in FIG. 1, power is supplied to SDRAM 20 pins Vcc and Vss. A typical SDRAM 20 provides optimum memory performance in a low voltage environment such as a 3.3 V environment. A system clock (CLK) signal is provided through a CLK input pin and a clock enable signal (CKE) is provided through a CKE input pin to SDRAM 20. The CLK signal is activated and deactivated based on the state of the CKE signal. All the input and output signals of SDRAM 20, with the exception of the CKE input signal during power down and self refresh modes, are synchronized to the active going edge (the positive going edge in the embodiment illustrated in FIG. 1 ) of the CLK signal.

A chip select (CS*) input pin inputs a CS* signal which enables, when low, and disables, when high a command decode 26. Command decode 26 is included in a command controller 28. Command decoder 26 receives control signals including a row address strobe (RAS*) signal on a RAS* pin, column address strobe (CAS*) signal on a CAS* pin, and a write enable (WE*) signal on a WE* pin. Command decoder 26 decodes the RAS*, CAS*, and WE* signals to place command controller 28 in a particular command operation sequence. Command controller 28 controls the various circuitry of SDRAM 20 based on decoded commands such as during controlled reads or writes from or to bank 0 memory array 22 and bank 1 memory array 24. A bank address (BA) signal is provided on a BA input pin to define which bank memory array should be operated on by certain commands issued by command controller 28.

Address inputs bits are provided on input pins A0–A10. As described below, both the row and column address input bits are provided on the address input pins. During write transfer operations, data is supplied to SDRAM 20 via input/output pins (DQ1–DQ-4). During read transfer operations, data is clocked out of SDRAM 20 via input/output pins DQ1–DQ-4. An input/output mask signal is provided on a DQM input pin to provide non-persistent buffer control for a data-in-buffer 30 and a data-out buffer 32.

SDRAM 20 must be powered-up and initialized in a predefined manner. In addition, both bank 0 and bank 1 memory arrays 22 and 24 must be precharged and placed in an idle state. The precharging of the bank memory arrays is preformed with a precharge command operation which is described in more detail below. Once in the ideal state, two AUTO-REFRESH operations must be performed. Two refresh commands are typically available in SDRAM 20 which are an AUTO-REFRESH command and a SELF-REFRESH command. The AUTO-REFRESH and SELF-REFRESH commands are performed with refresh controller 34, self-refresh oscillator and timer 36, and refresh counter 38 in a manner known in the art to refresh the memory arrays. Once the two AUTO-REFRESH operations are performed, SDRAM 20 is available for programming of a mode register 40. Mode register 40 is assumed to have an unknown state when SDRAM 20 is powered up. Consequently, before performing any operational command, mode register 40 must be set or programmed.

Mode register 40 is typically a persistent register wherein once programmed, the mode register retains the program op-code until the mode register is reprogrammed or SDRAM 20 loses power. Most of the possible programmable options of SDRAM 20 are defined in the op-codes stored in mode register 40. Typically mode register 40 is programmed by providing a desired op-code via the BA input pins and the A0–A10 address inputs, in conjunction with a SET MODE REGISTER command determined by CS*, RAS*, CAS*, and WE* being registered low.

A valid ACTIVE command is initiated by command controller 28 with the CS* and RAS* signals low with the CAS* and WE* signals high on a rising edge of the CLK signal. During the ACTIVE command the state of the BA signal determines which bank memory array to activate and address. During the ACTIVE command a value representing a row address of the selected bank memory array, as indicated by address bits on input pins A0–A10, is latched in a row address latch 42 in response to a clock signal generated from a clock generator circuit 44. The latched row address is provided to a row multiplexor 46 which provides a row address to row address buffers 48 to be provided to bank 0 memory array 22 or row address buffers 50 to be provided to bank 1 memory array 24 depending on the state of the BA signal. A row decoder 52 decodes the row address provided from row address buffers 48 to activate one of the 2,048 lines corresponding to the row address for read or write transfer operations, to thereby activate the corresponding row of storage cells in bank 0 memory array 22. Row decoder 54 similarly decodes the row address in row address buffer 50 to activate one of the 2,048 lines to bank 1 memory array 24 corresponding to the row address for read or write transfer operations, to thereby activate the corresponding row of storage cells in bank 1 memory array 24. In order to access a row once a row in the selected bank memory has been activated with the ACTIVE command, a bank memory array must be precharged with the below described PRE-CHARGE command or AUTO-PRECHARGE command before another ACTIVE command is applied to the bank memory array.

A valid READ command is initiated with the CS* and CAS* signals low, and the RAS* and WE* signals high on a rising edge of the CLK signal. The READ command from command controller 28 controls a column address latch 56 which receives address bits A0–A9 and holds a value representing a column address of the bank memory array selected by the BA signal at the time the READ command is initiated. Column address latch 56 latches the column address in response to a clock signal generated by a clock generator 58. Address pin A10 provides an input path for a command signal which determines whether or not an AUTO-PRECHARGE command, described in detail below, is to be initiated automatically after the READ command. The READ command provided from command controller 28 also initiates a burst read cycle, described in detail below, by starting a burst counter 60.

A column address buffer 62 receives the output of the burst counter 60 to provide the current count of the column address to a column decoder 64. Column decoder 64 activates four of the 1,024 ×4 lines, provided to seine amplifiers and input/output (I/0) gating circuit 66 and sense amplifiers and I/O gating circuit 68 corresponding to the current column address. Sense amplifiers and I/O gating circuits 66 and 68 operate in a manner known in the art to sense the data stored in the storage cells addressed by the active row decoder line and the active column decoder lines to provide the selected four bit byte of data from either bank 0 memory array 22 or bank 1 memory array 24 respectively to data-out buffer 32 during a read operation. Data-out buffer 32 provides the selected four bit byte of data to input/output data pins DQ1–DQ4.

In a burst read having a length of four, the initial column address stored in column address latch 56 is used to activate sense amplifiers and I/O gating circuits 66 or 68 during the first burst cycle of the burst read operation. Then, during the next three clock cycles burst counter 60 counts up from the column address stored in column address latch 56, as defined by a sequence type, to "burst" or clock-out the next three memory locations of data. A full-page burst will wrap around and continually restart the "burst" operation until a BURST TERMINATION command or PRECHARGE command is indicated by command controller 28 or until interrupted with another burst operation.

A valid WRITE command is initiated with the CS*, CAS*, and WE* signals low and the RAS* signal high on the rising edge of the CLK signal. The WRITE command provided from command controller 28 controls clock generator 58 to clock column address latch 56 which receives and holds a value representing a column address of the bank memory array selected by the state of the BA signal at the time the WRITE command is initiated, as indicated by the address provided on address input pins A0–A9. As with the read operation, during the WRITE command, address pin A10 provides the additional feature to select whether or not the below described AUTO-PRECHARGE command is to be initiated following the WRITE command. Burst counter 60 initiates the burst write cycle. Column address buffer 62 receives the output of the burst counter 60 and provides the current column address to column decoder 64. Column decoder 64 activates four of the 1,024×4 lines to sense amplifiers and I/O gating circuits 66 and 68 corresponding to the column address to indicate where the incoming four bit byte of data is to be stored in either bank 0 memory array 22 or bank 1 memory array 24.

During WRITE command operations data is provided on input/output pins DQ1–DQ4 to data-in buffer 30. Data in buffer 30 provides the input write data to a latch 70 corresponding to bank 0 memory array 22 and a latch 72 corresponding to bank 1 memory array 24. The four bit byte of input write data is provided from latch 70 or 72 to the selected bank memory array with sense amplifiers and I/O gating circuits 66 or 68 in a manner known in the art based on the activated four lines corresponding to the current column address.

During a burst write operation of length four, the first byte of data is stored at the memory array location addressed by the column address stored in column address latch 56. Similar to the read burst operation, during the next three clock cycles, burst counter 60 counts up from the column address stored in column latch 56, as defined by the sequence type, to "burst" or clock in the data to be stored in the next three memory locations. A full page burst will wrap around and continue writing data until terminated by the BURST TERMINATION command, PRECHARGE command, or until interrupted with another burst operation.

The burst read and write operation are controlled by the burst mode defined in mode register 40 which is programmable during the SET MODE REGISTER command. The burst operation provide for a continuous flow of data from or to the specified memory array location during read or write access. Burst lengths of 2, 4, 8, or full page (1,024) cycles are programmable into mode register 40 in one embodiment of SDRAM 20. In one embodiment of the present invention, a burst read/single write mode permits a write operation to be a burst length of one and yet allows the read operation to be the programmed burst length as defined in mode register 40.

In addition, a burst sequence is a programmable feature programmed into mode register 40 during the SET MODE REGISTER command. Typically two types of burst sequences are available for selection including a sequential sequence or an interleaving sequence. The sequential sequence bursts through sequential locations in one of the two bank memory arrays. The interleaving sequence interleaves between bank 0 memory array 22 and bank 1 memory array 24. In one embodiment of SDRAM 20, both the sequential and interleaving sequences support bursts of 2, 4, and 8 cycles. In this one embodiment, the sequential sequence supports full page length burst cycles.

Command controller initiates a valid PRECHARGE command with the CS*, WE*, and the RAS* signals low and the CAS* signal high on the positive going edge of the CLK signal. The PRECHARGE command operation deactivates and precharges the bank memory array selected by the state of the BA signal at the time the PRECHARGE command is initiated. In this way, the row previously accessed is deactivated and precharged so that row may be refreshed or another row accessed. Once a bank memory array has been precharged, that bank memory array is in an idle state and must be activated prior to another READ command or WRITE command being issued to that bank memory array. In the preferred embodiment of the SDRAM 20, multiple READ and WRITE commands do not require precharging between each command provided the same row is being accessed.

In a preferred embodiment of SDRAM 20, the PRECHARGE command allows either one or both banks to be precharged. Individual bank precharging is performed if the value on address input pin A10 is registered low at the time the PRECHARGE command is initiated. During individual bank precharging, the state of the BA signal defines which bank is precharged. Both banks are precharged when A10 is registered high at the time the PRECHARGE command is initiated. If A10 is registered high at the time the PRECHARGE command is initiated, BA is treated as a "don't care."

During any ACTIVE, READ, WRITE, or PRECHARGE command the bank memory array to be accessed is determined by the registering of the BA signal at the initiation of the command. Bank 0 memory array 22 is selected if the value of the BA signal is registered low and bank 1 memory array 24 is selected if the value of the BA signal is registered high. As described above, the 5BA signal determines the selection of one of the banks during a PRECHARGE command only when the value on input pin A10 is low. If the value on input pin A10 is high during the PRECHARGE command, BA becomes a "don't care."

When a row of a selected bank memory array is selected with an ACTIVE command that row of the bank memory array becomes activated and continues to remain active until a PRECHARGE command to that selected bank memory array is issued. In other words, the RAS* signal is only registered once externally, but an internally generated RAS* signal to the selected bank memory array remains active until a PRECHARGE command is provided. READ and WRITE commands do not necessarily require a PRE- CHARGE command to follow the command, but a bank memory array must be precharged prior to registering a new row address. When selecting a row within a bank memory array, the other bank memory array can remain active to permit READ and WRITE commands to interleave between the two bank memory arrays.

Precharging a bank memory array can, in most cases, be hidden due to the dual bank structure of SDRAM 20. To hide the precharging, a PRECHARGE command is issued to the bank memory array not being accessed while the bank memory array being accessed is in a burst mode.

During read operations within the same bank, much of the precharge $T_{RP}$ time can still be hidden when transitioning from one row to another. The PRECHARGE command may be initiated up to one clock cycle prior to the last data-out during a read operation, provided that the read latency is two or more clocks. When the read latency is one clock, the PRECHARGE command may only be issued when the final data-out is available. In any case, at least one clock cycle of the precharge time $T_{RP}$ must occur during the cycle the last data-out is being held valid. That is, one of two or two of three clock cycles of the precharge time may be hidden provided the read latency is two or more. Otherwise, only one precharge clock may be hidden.

WRITE commands require a write recovery time ($T_{WR}$) from the last data-in element to the beginning of the PRECHARGE command when the same bank memory array is going from a write command to a PRECHARGE command.

An AUTO-PRECHARGE command is a non-persistent feature in SDRAM 20 which performs all of the same individual bank precharge functions described above for the PRECHARGE command. The AUTO-PRECHARGE command feature of the preferred embodiment of SDRAM 20, permits a user to program a READ command or WRITE command that automatically performs a precharge upon the completion of the READ command or the WRITE command.

By using the AUTO-PRECHARGE command feature, a manual PRECHARGE command does not need to be issued during the functional operation of SDRAM 20. The AUTO-PRECHARGE command insures that the precharge is initiated at the earliest, valid stage within a burst cycle. The user is not allowed to issue another command until the precharged time ($t_{RP}$) is completed. Therefore, when an AUTO-PRECHARGE command is employed in SDRAM 20, the selected bank memory array must not be accessed again until $t_{RP}$, is complete. For example, if a read of two cycles is selected and three clock periods are required to satisfy $t_{RP}$ the bank memory array cannot be accessed during the two clocks following the completion of a burst operation. If a burst of four is programmed and three clock periods are required to satisfy $t_{RP}$, the bank memory array cannot be accessed during the one clock cycle following the completion of the burst, provided that the read latency is two or more clocks, otherwise, the bank memory array cannot be accessed during the two clocks following the completion of the burst cycle.

Write operations require the write recovery time ($T_{WR}$) from the last data-in element to the beginning of the PRECHARGE command when the same bank memory array is being accessed. Thus, the bank memory array cannot be reaccessed until $T_{WR}+t_{RP}$ from the last date-in element.

The read latency is a programmable feature of SDRAM 20 defined in mode register 40 during the SET MODE REGISTER command. Typically, read latencies of 1,2, or 3 clocks are available. The read latency guarantees at which clock the data will become available regardless of the system clock rate. Data can be made available on the input/output pins DQ1–DQ4 up to one clock cycle less than the read latency, depending on the frequency of the system clock. A read latency of two clocks programmed with a cycle rate which is greater than the minimum access time will provide data almost immediately after the first clock.

A no operation (NOP) command can be provided to SDRAM 20 to prevent other unwanted commands from being registered during idle or wait states.

Figure 2:
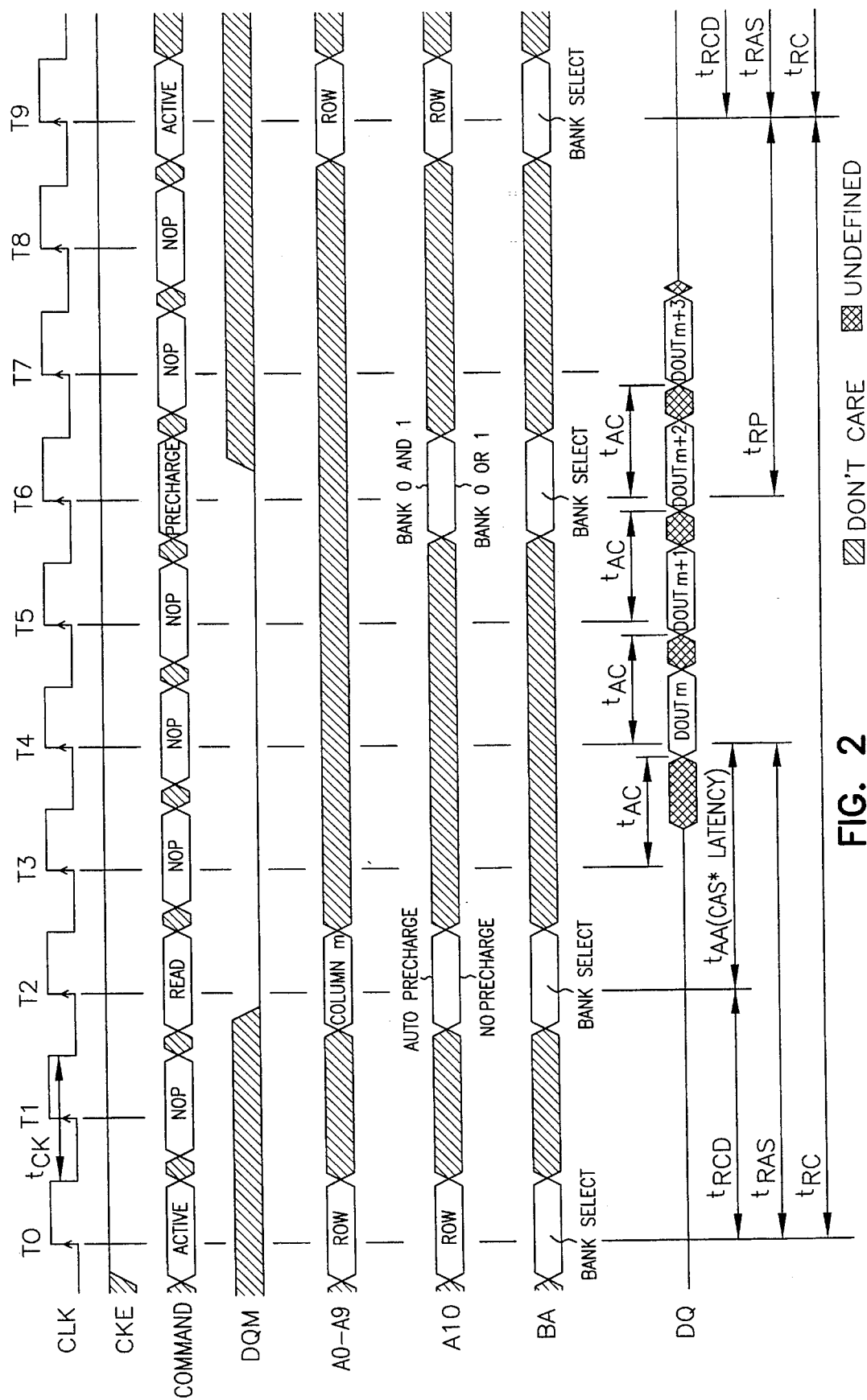
FIG. 2 is a timing diagram illustrating a four cycle read burst transfer operation.

A four cycle burst read operation is illustrated in timing diagram form in FIG. 2. As illustrated, the system clock cycle time is indicated by $t_{CK}$. The time from the initiation of an ACTIVE command to the initiation of a READ command is representing by $t_{RCD}$ and represents two clock cycles, such a between time $t_0$ and time $t_2$. The total read burst transfer cycle period is represented by $t_{RC}$ and represents nine clock cycles as illustrated in FIG. 2. The total ACTIVE command period, wherein the row address strobe is active, is represented by $t_{RAS}$, and represents four clock cycles as illustrated in FIG. 2. The READ access time for each cycle burst in represented by $t_{AC}$. The time from the initiation of the READ command to the DQ clock first data-out cycle is represented by $t_{AA}$ and indicates the column address strobe latency period and is two clock periods as illustrated in FIG. 2. The PRECHARGE command period ($t_{RP}$) is three system clock cycles as illustrated in FIG. 2.

As illustrated in FIG. 2, an ACTIVE command is initiated by command controller 28 at time $t_0$; the corresponding READ command is initiated at time $t_2$; the first cycle burst of data is output at time $t_4$; and the last of the four cycle data bursts is output at time $t_7$. At time $t_6$, a PRECHARGE command is initiated when the second to last data burst is output, and the next ACTIVE command is initiated at time $t_9$, three clock cycles after the PRECHARGE command at time $t_6$.

Figure 3:
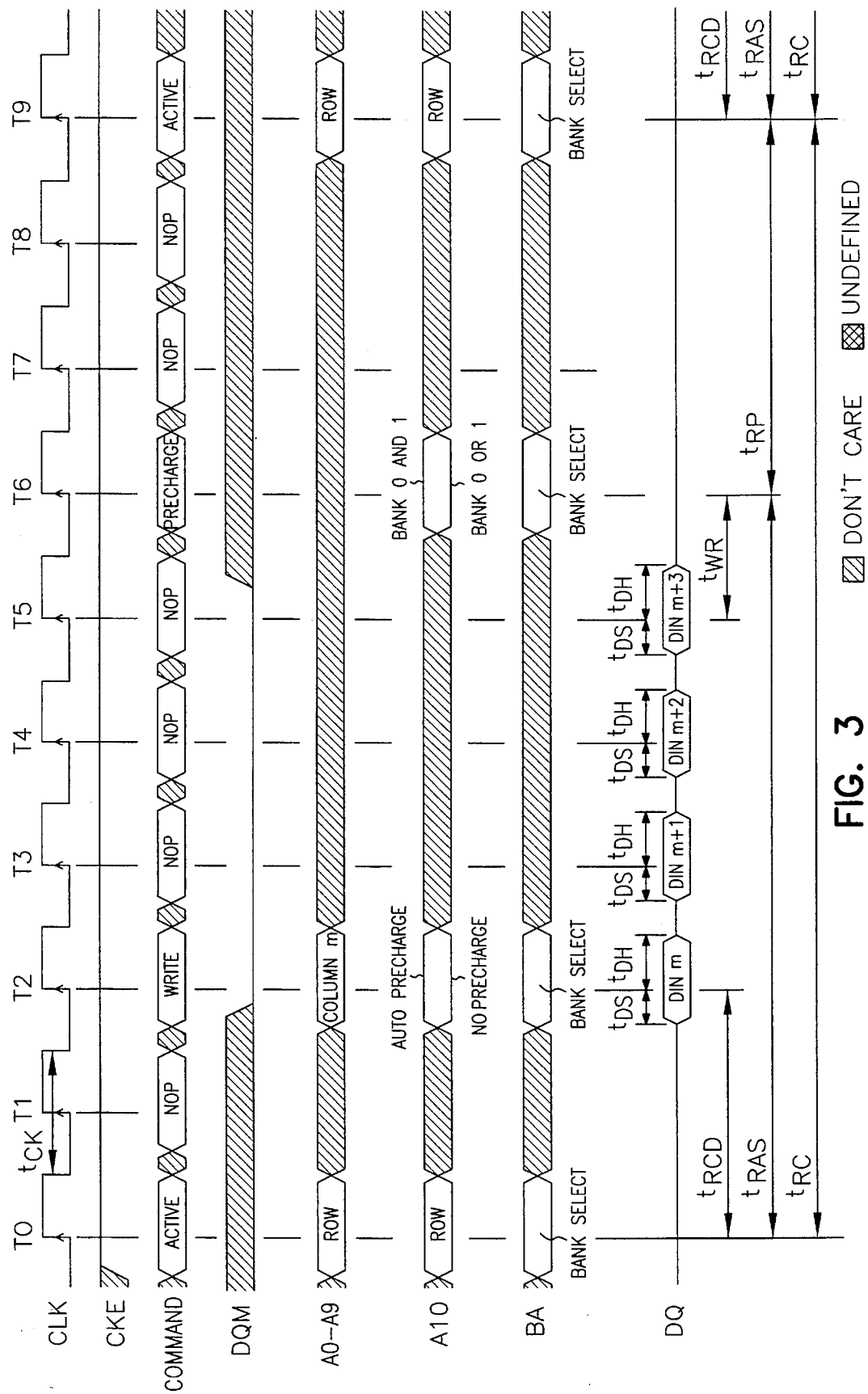
FIG. 3 is a timing diagram illustrating a four cycle write burst transfer operation.

A four cycle WRITE burst transfer operation is illustrated in timing diagram form in FIG. 3. The timing diagram of FIG. 3 is similar to the timing diagram of FIG. 2 illustrating the four cycle READ burst transfer operation. Therefore, only the differences between the WRITE and READ commands are now described. During a WRITE operation, the data-in setup time is represented by $t_{DS}$, and the data-in hold time is represented by $t_{DH}$. The write recovery time is indicated by $t_{WR}$, which represents one clock cycle in FIG. 3 between $t_5$ and $t_6$.

The time from when the WRITE command is initiated at $t_2$ to when the write recovery time is completed after four data bursts have been written into one of the bank memory arrays represents four clock cycles as illustrated in FIG. 3 between $t_2$ and $t_6$. Thus, as with the four cycle read burst transfer operation, the total command period ($t_{RCA}$) is again equal to nine clock cycles for the four cycle write burst transfer operation.

Both FIGS. 2 and 3 represent a four cycle burst transfer operation, but as described above SDRAM 20 preferably can be programmed to perform 2, 4, 8, or full page cycle burst operations and the present invention is not limited to a four burst transfer operation.

Figure 4:
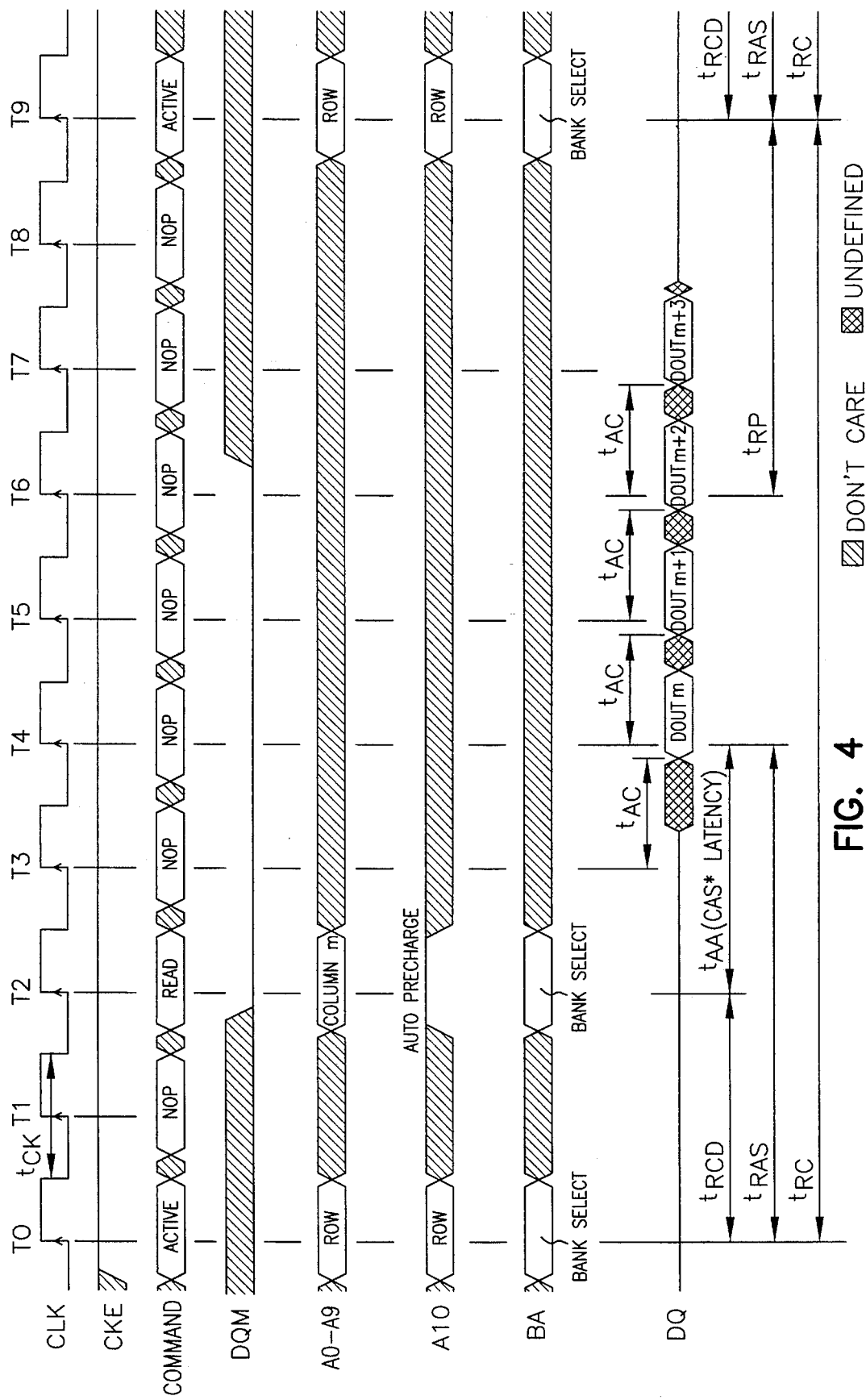
FIG. 4 is a timing diagram illustrating a four cycle read burst transfer operation implementing an AUTO-PRECHARGE command following a READ command.

A four cycle read burst transfer operation which utilizes a programmed READ command which automatically issues an AUTO-PRECHARGE command without having to issue and an actual PRECHARGE command is illustrated in FIG. 4 in timing diagram form. FIG. 4 is similar to FIG. 2 except at time $t_6$ a NOP command is issued rather than the PRECHARGE command since at time $t_6$ the AUTO-PRE- CHARGE command is internally performed. A similar modification could be made to FIG. 3 to illustrate an AUTO-PRECHARGE command following a WRITE command.

At many frequencies of the system clock (CLK) signal, the time to perform a PRECHARGE command ($t_{RP}$) and the delay time between the read address strobe to the column address strobe ($t_{RCD}$) do not meet typical timing specifications for a SDRAM. The $t_{RCD}$ delay represents the time between the initiation of an ACTIVE command to the beginning of either a READ command WRITE command. At certain faster frequencies of the CLK signal or in a slower SDRAM, the total time required for $t_{RP}$ and $t_{RCD}$ equals an extra clock cycle or system clock cycle time ($t_{CK}$) than if the two ($t_{RP}$ and $t_{RCD}$) were able to be accomplished as a single parameter thereby resulting in a wait cycle.

In either a READ command or WRITE command with either a PRECHARGE command or an AUTO-PRECHARGE command following the READ or WRITE command, the above-described problem of too much total time between the addition of $t_{RP}$ and $t_{RCD}$ may result in an additional wait cycle. For example, in FIGS. 2–4 the two NOP commands issued at time $t_7$ and time $t_8$ between the initiation of the PRECHARGE command at time $_6$ and the initiation of the ACTIVE command at time $_9$ in addition to the NOP command between the ACTIVE command and the following READ command, such as the NOP issued at time $t_1$ are not sufficient to encompass the total $t_{RP}$ plus $t_{RCD}$ time period. If this is the case, an additional NOP command needs to be inserted between the PRECHARGE command and the ACTIVE command, such as at time $t_9$ in FIGS. 2–4 in place of the ACTIVE command which adds an additional wait cycle to the total transfer operation cycle. For example, if the system clock cycle ($t_{CK}$) is equal to 10 nSec and the actual internal time to perform the PRECHARGE command is 34 nSec and the actual internal time between the initiation of an ACTIVE command and the initiation of the READ or WRITE command is 14 nSec, the 34 nSec time period is increased to four clocks or 40 nSec for time tap and the 14 nSec results in a $t_{RCD}$ equal to two clock cycles or 20 nSec.

In the example given above, the actual internal precharge time plus the actual internal 34 nSec resulting in a total of 48 nSec or just less than five clock cycles. Nevertheless, as described above, in prior art SDRAMs 60 nanoseconds or 6 clock cycles were needed between the initiation of the PRECHARGE command and the initiation of the READ or WRITE command. SDRAM 20 of the present invention solves this problem by allowing the ACTIVE command to be initiated one cycle early such as at time $t_9$. To permit this early initiation of the ACTIVE command, indicating circuitry 80 responds to the PRECHARGE command from command controller 28 to issue a PRECHARGE complete signal on a line 82 when the PRECHARGE is internally finished. When the ACTIVE command is initiated by command controller 28, clock generator 44 still latches the row address, input from address input pins A0–A10, into row address latch 42. However, row address 42 internally holds the row address until the internal precharge operation is complete, as indicated by the precharge complete signal on line 82. In this way, the wasted wait cycle is removed.

In one embodiment of the invention, indicating circuitry 80 is implemented with a time out circuit which begins timing from the beginning of the PRECHARGE or AUTO-PRECHARGE command such at time $t_6$ and based on an internal timer. When manufacturing a SDRAM 20 according to this embodiment of the present invention, the SDRAM is typically characterized to determine an estimated internal time to perform a precharge operation and "hardwired" by metal mask or fuse option.

In another embodiment of the present invention, indicating circuitry 80 is implemented in a monitoring circuit which monitors the appropriate circuitry in SDRAM 20 to determine when the internal precharge operation is completed so that the appropriate bank memory array may be activated and a row address may be released from row address latch 42 to row multiplexor 46 to be provided to the appropriate selected bank memory array.

Indicating circuitry 80 and row address latch 42 according to the present invention can operate in other know manners to still encompass the feature of the present invention to permit pipelining of the ACTIVE and PRECHARGE commands. For example, by the above described one clock early initiation of the ACTIVE command following a PRECHARGE command to save one clock cycle with certain faster frequencies of the system clock signals CLK or with certain slower versions of the SDRAM. In addition, the invention applies similarly to an AUTO-PRECHARGE command or a PRECHARGE command.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A memory device including a memory array of storage cells organized in rows and column for storing data and responsive to command signals, the memory device operating in synchronization with active edges of a system clock, the memory device comprising:

a command decoder/controller responsive to selected command signals to initiate, at a first active edge of the system clock, a first command controlling a first operation on the memory array, and to initiate, at a second active edge of the system clock, a second command controlling a second operation on the memory array, wherein the second active edge of the system clock occurs during the first operation;

indicating circuitry responsive to the first command to provide a first command complete signal indicating the completion of the first operation; and second circuitry responsive to the second command to perform a first portion of the second operation, and responsive to the first command complete signal to perform a second portion of the second operation.

2. The memory device of claim 1 wherein the second command is an active command and wherein the first portion of the second operation includes receiving and holding a value representing a row address of the memory array.

3. The memory device of claim 2 wherein the second portion of the second operation includes releasing the row address and activating a row of storage cells in the memory array.

4. The memory device of claim 1 wherein the first command is a precharge command and wherein the first operation includes precharging and deactivating the memory array.

5. The memory device of claim 1 wherein the first command is a transfer command wherein the first operation includes a first transfer operation portion for transferring data to or from a storage cell in the memory array and a second auto-precharge operation portion wherein the command decoder/controller automatically initiates the second auto-precharge operation portion after the first transfer operation portion.

6. The memory device of claim 5 wherein the transfer command is a read command and the first transfer operation portion reads data from the storage cell in the memory array.

7. The memory device of claim 5 wherein the transfer command is a write command and the first transfer operation portion writes data to the storage cell in the memory array.

8. The memory device of claim 1 wherein the memory device is a synchronous dynamic random access memory (SDRAM).

9. The memory device of claim 1 wherein the indicating circuitry includes a timeout circuit.

10. The memory device of claim 1 wherein the indicating circuitry includes a monitoring circuit.

11. A method of pipelining commands in a memory device having a memory array of storage cells organized in rows and columns for storing data and responsive to command signals, the memory device operating in synchronization with active edges of a system clock, the method comprising the steps of:

initiating, at a first active edge of the system clock, a first command controlling a first operation on the memory array;

initiating at a second active edge of the system clock, a second command controlling a second operation on the memory array, wherein the second active edge of the system clock occurs during the first operation;

indicating when the first operation is completed in response to the first command;

performing a first portion of the second operation in response to the second command; and performing a second portion of the second operation in response to the indicating step indicating that the first operation is completed.

12. The method of claim 11 wherein the second command is an active command and wherein the step of performing the first portion of the second operation includes the steps of receiving and holding a value representing a row address of the memory array.

13. The method of claim 12 wherein the step of performing the second portion of the second operation includes the steps of releasing the row address and activating a row of storage cells in the memory array.

14. The method of claim 11 wherein the first command is a precharge command and wherein the method further comprises the step of performing the first operation which includes the steps of precharging and deactivating the memory array.

15. The method of claim 11 wherein the first command is a transfer command and wherein the method further includes the step of performing the first operation which includes transfer steps of transferring data to or from a storage cell in the memory array and includes auto-precharge steps of automatically precharging and deactivating the memory array.

16. The method of claim 15 wherein the transfer command is a read command and the transfer steps include the step of reading data from the storage cell in the memory array.

17. The method of claim 15 wherein the transfer command is a write command and the transfer steps include the step of writing data to a storage cell in the memory array.

18. The method of claim 11 wherein the method pipelines commands in a synchronous dynamic random access memory (SDRAM).

19. The method of claim 11 wherein the indicating step includes the step of timing from the beginning of the initiation of the first command until an estimated time to perform the first command.

20. The method of claim 11 wherein the indicating step includes the step of monitoring circuitry in the memory device determine when the first operation is completed.

21. A method of performing a transfer operation in a synchronous dynamic random access memory (SDRAM) responsive to command signals and address bits and including a memory array of storage cells organized in rows and columns for storing data, the method comprising the steps of:

initiating, at different times, a precharge command, an active command, and a transfer command, wherein the active command initiates during the precharge command;

deactivating and precharging the memory array in response to the precharge command;

indicating a completion of a precharge command operation;

receiving and holding a value representing a row address of the memory array as indicated by the address bits provided at the time the active command is initiated;

releasing the row address and activating a row of storage cells in the memory array in response to the indicating step indicating the completion of the precharge command operation;

receiving and holding a value representing a column address of the memory array as indicated by the address bits provided at the time the transfer command is initiated; and transferring data from or to a storage cell of the memory array identified by the released row address and the held column address.

22. The method of claim 21 wherein the transfer command is a read command such that data is read from the memory array in the transferring step.

23. The method of claim 21 wherein the transfer command is a write command such that data is written into the memory array in the transferring step.

24. The method of claim 23 further comprising the step of automatically initiating an auto-precharge command in place of the precharge command based on the transfer command being initiated and the state of a command signal bit.

* * * * *

UNITED STATES PATENT AND TRADEMARK OFFICE
CERTIFICATE OF CORRECTION

PATENT NO.    :   5,600,605
DATED         :   February 4, 1997
INVENTOR(S)   :   Scott Schaefer It is certified that error appears in the above-identified patent and that said Letters Patent is hereby corrected as shown below:

At Column 10, line 39, please delete "column" and insert --columns--.

Signed and Sealed this

Fourteenth Day of October, 1997

Attest:

BRUCE LEHMAN

Attesting Officer

Commissioner of Patents and Trademarks